US012437971B2

(12) United States Patent
Zalieckas

(10) Patent No.: US 12,437,971 B2
(45) Date of Patent: Oct. 7, 2025

(54) LARGE AREA MICROWAVE PLASMA CVD APPARATUS

(71) Applicant: Vestlandets Innovasjonsselskap AS, Bergen (NO)

(72) Inventor: Justas Zalieckas, Bergen (NO)

(73) Assignee: VESTLANDETS INNOVASJONSSELSKAP AS, Bergen (NO)

( * ) Notice: Subject to any disclaimer, the term of this patent is extended or adjusted under 35 U.S.C. 154(b) by 0 days.

(21) Appl. No.: 17/052,346

(22) PCT Filed: May 8, 2019

(86) PCT No.: PCT/NO2019/050103

§ 371 (c)(1),
(2) Date: Nov. 2, 2020

(87) PCT Pub. No.: WO2019/216772

PCT Pub. Date: Nov. 14, 2019

(65) Prior Publication Data

US 2021/0057190 A1 Feb. 25, 2021

(30) Foreign Application Priority Data

May 8, 2018 (NO) .................................... 20180654

(51) Int. Cl.
*H01J 37/32* (2006.01)
*C23C 16/511* (2006.01)

(52) U.S. Cl.
CPC .. *H01J 37/32229* (2013.01); *H01J 37/32192* (2013.01); *H01J 37/32266* (2013.01);
(Continued)

(58) Field of Classification Search
CPC ........ H01J 37/32192–32311; H01L 21/67069; C23C 16/274; C23C 16/45536–45542; C23C 16/511; C23C 16/517
See application file for complete search history.

(56) References Cited

U.S. PATENT DOCUMENTS 5,003,152 A * 3/1991 Matsuo ................ C23C 16/511 118/723 R
5,230,740 A 7/1993 Pinneo
(Continued)

FOREIGN PATENT DOCUMENTS

CN 103526187 A 1/2014
CN 104934702 A 9/2015
(Continued)

OTHER PUBLICATIONS

Amr M. Nour Eldeen and Islam A. Eshrah. CRLH Waveguide with Air-Filled Double-Ridge Corrugations. 2011 IEEE International Symposium on Antennas and Propagation (APSURSI) (Year: 2011).*
(Continued)

*Primary Examiner* — Kurt Sweely
(74) *Attorney, Agent, or Firm* — Birch, Stewart, Kolasch & Birch, LLP

(57) ABSTRACT

A large area microwave plasma chemical vapour deposition, LA MPCVD reactor apparatus and method for large area microwave chemical vapour deposition, comprising a reactor chamber adapted to provide a plasma region in an interior of the reactor chamber by electromagnetic energy at a first frequency, and a CRLH waveguide section adapted to operate with an infinite wavelength at the first frequency and having in a wall a coupler means arranged to couple electromagnetic energy from an interior of the CRLH waveguide section to the interior of the reactor chamber.

13 Claims, 12 Drawing Sheets

(52) U.S. Cl.
CPC ....... *C23C 16/511* (2013.01); *H01J 37/32238* (2013.01); *H01J 37/32256* (2013.01)

(56) References Cited

U.S. PATENT DOCUMENTS

| | | | | | |
|---|---|---|---|---|---|
| 5,302,803 | A * | 4/1994 | Stevens | H01J 37/32229 | 219/121.41 |
| 5,479,875 | A * | 1/1996 | Tachibana | C23C 16/278 | 117/103 |
| 5,643,365 | A * | 7/1997 | Blinov | C23C 16/511 | 427/575 |
| 6,026,762 | A * | 2/2000 | Kao | H01J 37/32357 | 315/111.21 |
| 6,645,343 | B1 * | 11/2003 | Wild | H01J 37/32192 | 118/723 MW |
| 7,446,712 | B2 | 11/2008 | Itoh et al. | | |
| 2004/0107910 | A1 * | 6/2004 | Nakata | H01J 37/32192 | 118/723 MW |
| 2005/0000446 | A1 | 1/2005 | Nakata | | |
| 2005/0160986 | A1 | 7/2005 | Hur et al. | | |
| 2006/0153994 | A1 | 7/2006 | Gicquel et al. | | |
| 2007/0034157 | A1 | 2/2007 | Nakata | | |
| 2012/0177542 | A1 | 7/2012 | Chang | | |

FOREIGN PATENT DOCUMENTS

| | | | |
|---|---|---|---|
| EP | 0702393 | A2 | 3/1996 |
| JP | 8-138889 | A | 5/1996 |
| JP | 2004-200646 | A | 7/2004 |
| JP | 2007-180034 | A | 7/2007 |
| KR | 2017 0101452 | A | 9/2017 |
| RU | 2466943 | C2 | 11/2012 |
| WO | 2017/014593 | A1 | 1/2017 |

OTHER PUBLICATIONS

IN 202047049804; "Examination Report"; Mar. 17, 2021; 5 pages.

NO 20180654; Norwegian Search Report; Oct. 25, 2018; 2 pages.

PCT/NO2019/050103; International Search Report and Written Opinion; Aug. 29, 2019; 16 pages.

Kim J et al: "Large-area surface wave plasmas using microwave multi-slot antennas for nanocrystalline diamond film deposition", Plasma Sources Science and Technology, Institute of Physics Publishing, Bristol, GB, vol. 19, No. 1, Feb. 1, 2010 (Feb. 1, 2010), p. 15003.

Chen et al: "Unequally Spaced and Excited Resonant Slotted-Waveguide Antenna Array Based on an Improved Resonant-Slot Coupled Cavity Chain Composite Right/Left-Handed Waveguide", Progress in Electromagnetics Research, vol. 110, Jan. 1, 2010 (Jan. 1, 2010), pp. 421-435.

Caloz C et al: "Composite right/left-handed transmission line metamaterials", IEEE Microwave Magazine, IEEESERVICE Center, Piscataway, NJ, US, vol. 5, No. 3, Sep. 1, 2004, pp. 34-50.

Kromka et al., "Linear antenna microwave plasma CVD deposition of diamond films over large areas", Vacuum, vol. 86, 2012, pp. 776-779.

Lebedev, "Microwave discharges at low pressures and peculiarities of the processes in strongly non-uniform plasma", Plasma Sources Sci. Technol., vol. 24, 2015 (Published Aug. 20, 2015), pp. 1-39.

Li et al., "Research on microwave mode and coupling energy in plasma reactor design for MPCVD diamond", 3rd International Conference on Material, Mechanical and Manufacturing Engineering (IC3ME 2015), 2015, pp. 2170-2176.

Liao et al., "Left-Handed Transmission Line Based on Resonant-Slot Coupled Cavity Chain", IEEE Microwave and Wireless Components, vol. 17, No. 4, Apr. 2007, pp. 292-284.

Liao et al., "Synthesis, Simulation and Experiment of Unequally Spaced Resonant Slotted-Waveguide Antenna Arrays Based on the Infinite Wavelength Propagation Property of Composite Right/Left-Handed Waveguide", IEEE Transactions on Antennas and Propagation, vol. 60, No. 7, Jul. 2012, pp. 3182-3194.

Silva et al., "Microwave engineering of plasma-assisted CVD reactors for diamond deposition", J. Phys.; Condens. Matter, vol. 21, 2009 (Published Aug. 19, 2009), pp. 1-16.

Ueda et al., "Dielectric-Resonator-Based Composite Right/Left-Handed Transmission Lines and Their Application to Leaky Wave Antenna", IEEE Transactions on Microwave Theory and Techniques, vol. 56, No. 10, Oct. 2008, pp. 2259-2269.

* cited by examiner

LARGE AREA MICROWAVE PLASMA CVD APPARATUS

TECHNICAL FIELD

The present invention relates to a reactor apparatus and a method for microwave plasma chemical vapor deposition MPCVD.

BACKGROUND ART

Known microwave plasma chemical vapor deposition, MPCVD, reactors, employ a microwave energy source that is coupled and delivers microwave energy to the inside of a MPCVD reactor chamber. The MPCVD reactor chamber, forming a resonant cavity for the received microwave energy, is designed to shape the electrical field of the electromagnetic energy within the chamber with a field strength in a vicinity of a substrate that is sufficiently high to form a high temperature plasma that promotes a reaction that forms a vapor of material that becomes deposited on the nearby located substrate.

In a known MPCVD reactor arrangement for diamond material deposition, microwaves generated by microwave energy source typically enter the reactor chamber through a traditional waveguide arranged between the microwave radiation energy source and the reactor chamber, so as to couple an output from the microwave radiation energy source via a traditional waveguide coupler in through an opening in a wall of the reactor chamber. Waves that have entered the reactor space are by the design and shape of the chamber deflected by the walls of the reactor chamber and propagate further by reflection from the inner walls of the cavity, so as to be concentrated to form the plasma in a relatively small volume of the atmosphere of the reactor chamber immediately above a substrate holder suitable located within the reaction chamber. The reaction of constituents of the atmosphere then takes place within the relatively small plasma region at which the strong localized electric field of the microwave energy within the chamber ionizes working gases to form diamond material, and deposition of the diamond material takes place on a suitable substrate that is supported on the substrate holder. The substrate holder is typically arranged to move vertically inside the chamber, allowing also resonant properties of the resonant cavity to be adjusted. This can be beneficial for higher density plasma which tends to reflect part of the incoming radiation, which in turn affects resonant properties of the cavity.

Some documents with teachings related to microwave energy and MPCVD reactors are:

A. Kromka et al, Linear antenna microwave plasma CVD deposition of diamond films over large areas, Volume 86, Issue 6, 27 Jan. 2012, Pages 776-779;

S. Liao et al, Synthesis, Simulation and Experiment of Unequally Spaced Resonant Slotted-Waveguide Antenna Arrays Based on the Infinite Wavelength Propagation Property of Composite Right/Left-Handed Waveguide, IEEE Transactions on Antennas and Propagation (Volume: 60, Issue: 7, July 2012);

J. Kim et al, Large-area surface wave plasmas using microwave multi-slot antennas for nanocrystalline diamond film deposition, Plasma Sources Science and Technology, Volume 19, Number 1;

Microwave engineering of plasma-assisted CVD reactors for diamond deposition, Journal of Physics Condensed Matter (Impact Factor: 2.35). 09/2009; 21(36):364202. DOI: 10.1088/0953-8984/21/36/364202;

US2005/0160986A1, J.-H. Hur et. al., 2005 Jul. 28;

L. XiaoJing et. al., IC3ME 2015 (pages 2170-2176);

U.S. Pat. No. 5,230,740A, J. E. Pinneo; 1993.07.27;

US2006/0153994A1, A. H. Gicquel et. al., 2006 Jul. 13;

CN 103526187A, Wuhan Inst. Technology, 2014.01.22.

Y. A. Lebedev. Microwave discharges at low pressures and peculiarities of the processes in strongly non-uniform plasma. Plasma Sources Sci. Technol. 24 053001, 2015, reviews the methods of microwave plasma generation at pressures from 10-2 approximately to kPa with centimeter-millimeter wavelength microwaves on the basis of scientific publications since 1950 up to the present.

US 2005/000446 A1 relates to a plasma processing apparatus including at least one electromagnetic wave source for generating an electromagnetic wave, an electromagnetic wave-distributing waveguide portion for distributing the electromagnetic wave generated from the electromagnetic wave source, a plurality of waveguides each coupled with the electromagnetic wave-distributing waveguide portion, the waveguides being provided on the same plane, a plurality of slots provided in each of the waveguides, at least one electromagnetic wave radiating window provided to face each slot, and a vacuum vessel in which a plasma is generated by the electromagnetic wave radiated from the electromagnetic wave radiating window.

EP 0702393 A2 discloses a plasma processing apparatus including a plasma chamber having a narrow window, and a rectangular waveguide for coupling with the plasma chamber, the rectangular waveguide has a long slot disposed in an E-plane thereof so as to oppose to the narrow window of the plasma chamber and to extend along a waveguide-axis direction of the rectangular waveguide. There is further provided at least two long slots disposed in at least one rectangular waveguide.

KR 20170101452 A relates to a surface wave plasma device, comprising: a first waveguide including a plurality of slot antennas connected to a first microwave power source on one end; a second waveguide including a plurality of slot antennas, disposed in parallel with the first waveguide having a second microwave power source connected to an opposite end of the first waveguide; a dielectric plate to introduce microwaves radiated from the slot antennas into a chamber to generate surface wave plasma; and a gas supply portion to supply gas into the chamber.

The MPCVD reactors above have a limited deposition area, and it is therefore a need for a large area, energy efficient plasma chemical vapor deposition reactor apparatus.

SUMMARY OF THE INVENTION

According to the invention a new large area microwave plasma chemical vapor deposition, LA MPCVD, reactor apparatus design is proposed.

The present invention provides a LA MPCVD reactor apparatus comprising a Composite Right/Left-Handed, CLRH, waveguide section, according to the independent claim 1.

The present invention is also a method for providing a large area plasma chemical vapour deposition in a reactor chamber.

The LAMPCVD and the method of the invention allows deposition of uniform films over large area on different substrates.

An example of an application for the reactor according to the invention, is the possibility to scale the reactor cavity to increase the size of the region of generated plasma, allowing e.g. standard sized wafers to be diamond coated.

DESCRIPTION OF THE DRAWINGS

Embodiments of the invention will now be described in further detail with reference to the following figures in order to exemplify its principles, operation and advantages. Please note that for better illustration of the microwave characteristics, several of the drawings illustrate the cavity, i.e. the internal space of elements and not the physical elements themselves. This makes it easier to visualize the cavities themselves and the electric field distribution within the cavities.

FIG. 15 illustrate in a block diagram an embodiment of a method for adapting the reactor to different working frequencies deviating from a nominal frequency that the reactor is designed for.

Figure 1:
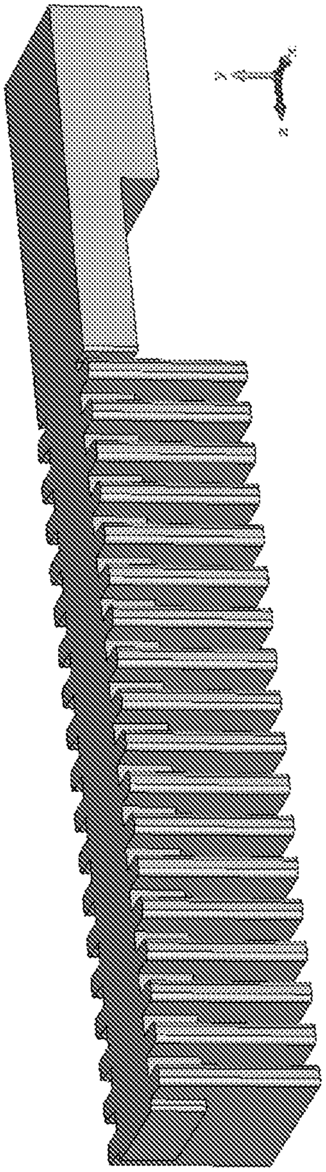
FIG. 1 illustrates in a perspective view a cavity of a Composite Right/Left-Handed, CRLH waveguide, according to an embodiment of the invention.

In the drawings the x and y-directions are defined to be perpendicular to the CLRH waveguides, while the z-direction is in the longitudinal direction of the waveguide. In addition the y-direction is the direction from the waveguide to the reactor. Directions are indicated in most of the drawings. The definition of the directions are given only for illustration and other definitions could have been be used instead.

The figures as filed are submitted in color. This improves illustration of the current distribution in the reactor and its elements, such as a e.g. the current distribution in the CLRH waveguide section. Red colour, indicates the highest current density, while blue is the lowest current density. Inbetween red and blue there are orange, yellow and green areas with decreasing current densities. The red color, and thus the highest current density can be seen e.g. in the centre, along the CLRH section of FIG. 2 and FIG. 3, In the middle of the top chamber in FIG. 7B and FIG. 9B, as well as the middle of FIG. 11.

DETAILED DESCRIPTION OF THE INVENTION

Figure 3:
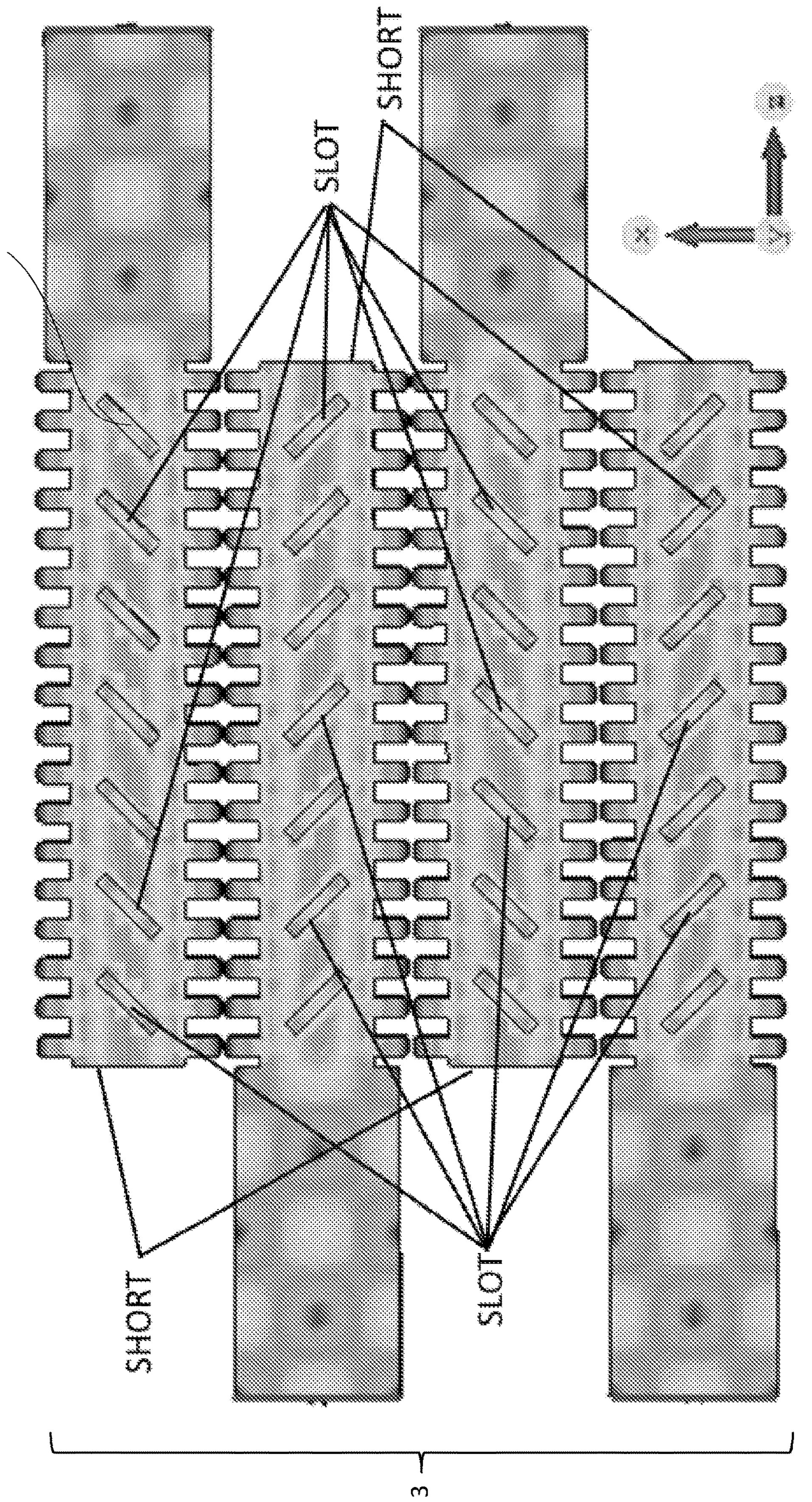
FIG. 3 is another coupler top view drawing illustrating the cavities and principle of a typical configuration and homogenous current density distribution of a second example of a LA MPCVD reactor apparatus according to the invention employing a plurality of side-by-side disposed end-shorted CRLH wave guides with slots for coupling microwave energy from the waveguides. It should be noted that only the cavities of the CRLH wave guides are illustrated and not the physical device.

In the following, the present invention is referred to as a Large Area Microwave Plasma Chemical Vapor Deposition Reactor, and identified herein by the acronym LA MPCVD. In general, the inventive LA MPCVD provides in a first aspect a new coupling of microwave energy into a large area deposition chamber. As illustrated in FIG. 3, the microwave energy coupler is based on at least a section of an infinite wavelength property of a composite right/left-handed, CRLH, waveguide. The CRLH waveguide device may be a shorted section of a CRLH waveguide, constituted by a chain of waveguide unit cells. Each unit cell in a chain is designed so as to provide a phase shift for left-handed, LH, and right-handed, RH, passbands with zero dispersion for a frequency that is matching the working frequency of the microwave energy. Typically, in a practical embodiment the microwave energy generator may operate at a frequency of 2.45 GHz. In application of this property of the CRLH waveguide operated at its "infinite wavelength propagation frequency", the electrical current in different parts of a wall of the waveguide appears at any instance in time to be uniform, or "coherent", without apparent variation along the direction of microwave propagation, longitudinally in the waveguide as indicated by the axis labelled "z", and extending over substantially the full length of the shorted section of CRLH waveguide comprised in CRLH waveguide device of the invention.

In order to couple the apparently uniform, or "infinite wavelength", "coherent" electromagnetic microwave energy out of the waveguide and into the LA MPCVD reactor chamber, the CRLH waveguide device of the invention is provided with one or more appropriately dimensioned and oriented slots in a wall of the CRLH waveguide that carries the uniformly distributed, "coherent" electrical current set up by the microwave energy that is propagated in the waveguide. In this way, all slot elements along the shorted CRLH waveguide wall can be excited to output microwave energy that timewise is either inphase or antiphase.

To extend the area of the uniform electrical field also in a direction that is different from the direction microwave energy propagation in the CRLH waveguide of a single CRLH waveguide device of the invention, such as for example in the direction indicated by the axis labeled "y", several CRLH waveguide devices may be positioned in a side-by-side configuration, and operated simultaneously to establish a large area uniform microwave energy electrical field, setting up a large area uniform plasma region, within the reaction chamber.

Figure 10A:
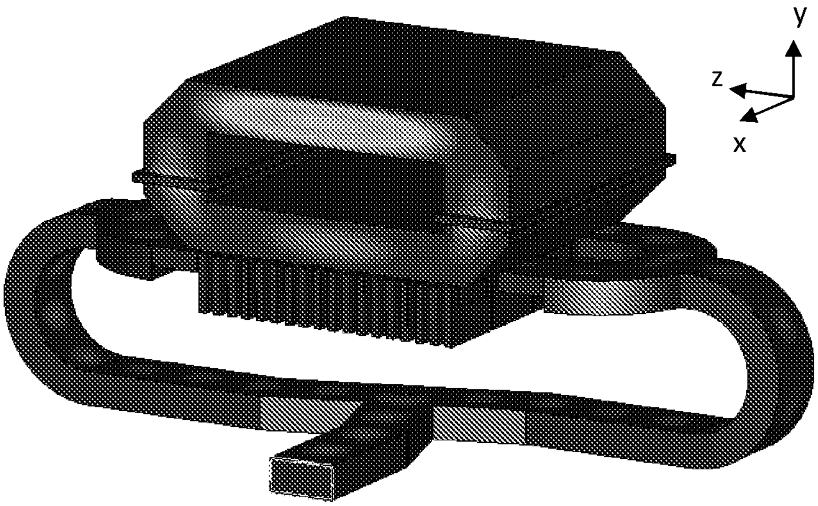
FIG. 10A is a perspective view drawing illustrating the electrical field in the cavity at a given instant of a LA MPCVD reactor apparatus according to the embodiment illustrated in FIG. 7, comprising four side-by-side disposed end-shorted CRLH wave guide devices and an arrangement of waveguide lines and splitters, such as T-junctions, arranged to feed microwave energy to all CRLH wave guide devices from a common microwave energy source. Quartz windows, arranged horizontally, are also shown.
Figure 10B:
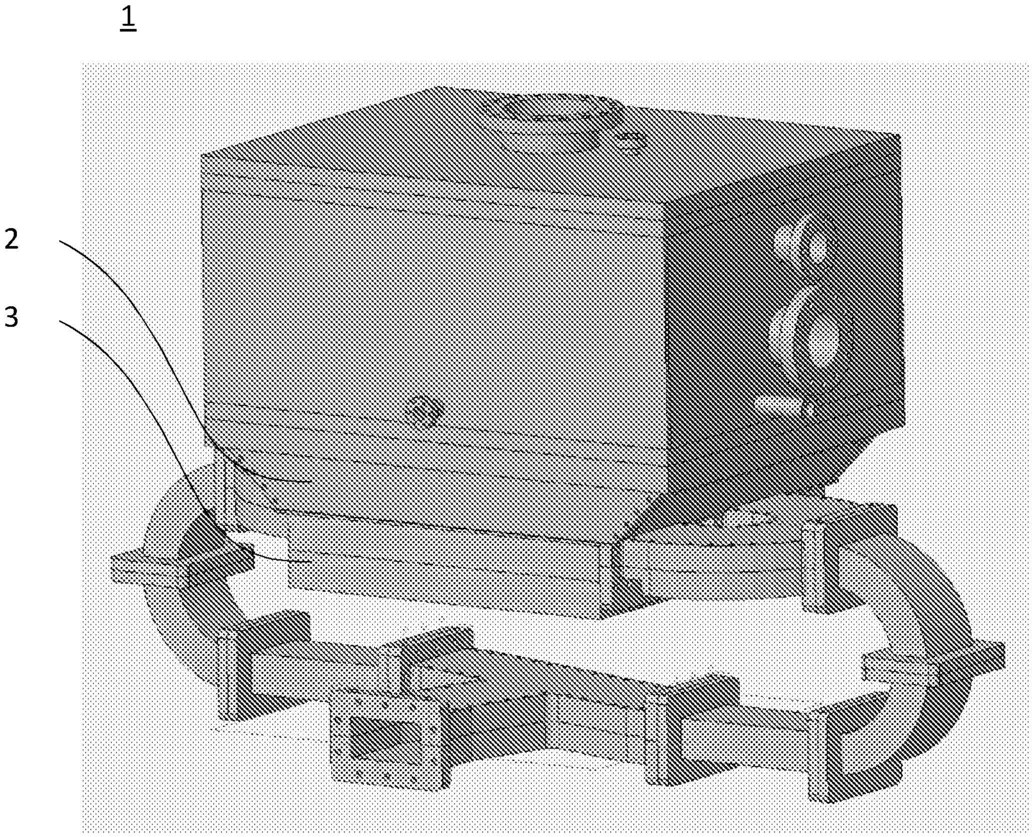
FIG. 10B is a perspective view illustrating a physical implementation of the embodiment in FIG. 10A. Here the LA MPCVD reactor comprises four side-by-side disposed end-shorted CRLH wave guide devices below the vacuum chamber and an arrangement of waveguide lines and splitters, such as T-junctions, arranged to feed microwave energy to all CRLH wave guide devices from a common microwave energy source to be connected to the rectangular input port at the bottom of the drawing. An impedance matching unit, such as a 3-stub tuner may be used between the energy source and the input port.

In a first embodiment the invention is therefore a LA MPCVD reactor apparatus (1). The reactor apparatus (1) comprises a reactor chamber (2) adapted to provide a plasma region in an interior of the reactor chamber by electromagnetic energy at a first frequency. It further comprises a CRLH waveguide section (3) adapted to operate with an infinite wavelength at the first frequency and having in a wall a coupler means (4) arranged to couple electromagnetic energy from an interior of the CRLH waveguide section (3) to the interior of the reactor chamber (2). Two different reactor apparatus is illustrated indirectly in FIGS. 4A and 7A by their internal cavities. FIG. 10B illustrate a reactor apparatus (1) with the internal cavity of FIG. 7A. A CRLH waveguide section that may be used to illustrate a CRLH waveguide cavity according to this embodiment is illustrated in FIG. 1.

In a related embodiment the coupler means comprises a plurality of electromagnetic energy couplers spaced with respect to each other. This coupler means may comprise a slot in the wall of the CRLH waveguide section.

In a related embodiment, one or more CRLH waveguides in the CRLH waveguide section has a second, shorted end.

The LA MPCVD reactor apparatus above may comprise a source of electromagnetic energy having an energy output, and wherein one or more CRLH waveguides in the CRLH waveguide section has a first energy input end coupled to the energy output of the source of electromagnetic energy.

A tuning device may be connected between the energy output and the energy input.

One or more CRLH waveguides in the CRLH waveguide section may have a second, shorted end, as illustrated in FIG. 3. Here the shortened end is opposite the first energy input end.

Figure 7A:
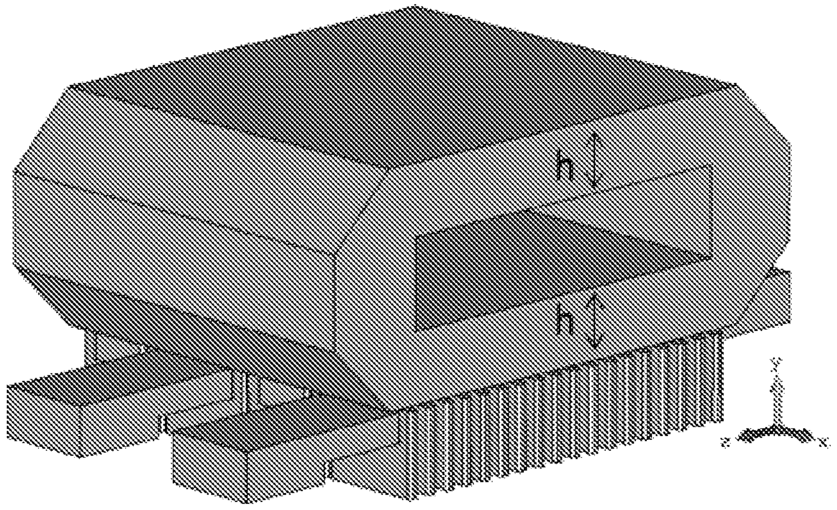
FIG. 7A illustrates a 3D CAD model of a resonant cavity according to the invention connected to a set of CRLH waveguides as illustrated in FIG. 3. Please note that only the cavities are shown here. Here the reactor cavity is split in two main volumes, the first and second sub-chambers In this example corresponding to the lower and upper volumes, respectively.

In a second embodiment that is illustrated in e.g. FIG. 7A, the reactor chamber comprises a first and a second sub chamber, wherein the first sub chamber comprises the coupler means, and the second sub-chamber is adapted to comprise the plasma region. The electromagnetic energy is provided from the CRLH waveguide section to the second sub-chamber via the first sub-chamber. Other elements apart from the reactor chamber may be the same as in the first embodiment.

The first and second sub-chambers may in a cross section have the same area.

The second sub-chamber may comprise quartz windows arranged to separate the plasma region from atmospheric pressure.

The first and second sub-chambers may be arranged on top of each other and interconnected in each end as illustrated in FIG. 7A.

The electromagnetic energy may be microwave energy at the first frequency, wherein the first frequency may, in a related embodiment be 2.45 GHz.

The LA MPCVD reactor apparatus may comprise one or more CRLH waveguides.

In a third embodiment that may be combined with any of the embodiments above, the CRLH waveguide section comprises a plurality of the CRLH waveguide sections arranged side-by-side as illustrated in FIG. 3.

In a fourth embodiment that may be combined with any of the embodiments above, the LA MPCVD reactor apparatus of any of the claims above, wherein the CRLH waveguide section comprises periodically cascaded unit cells.

In a related embodiment, the unit cells relationship between frequency and phase shift may be configurable.

Figure 14A:
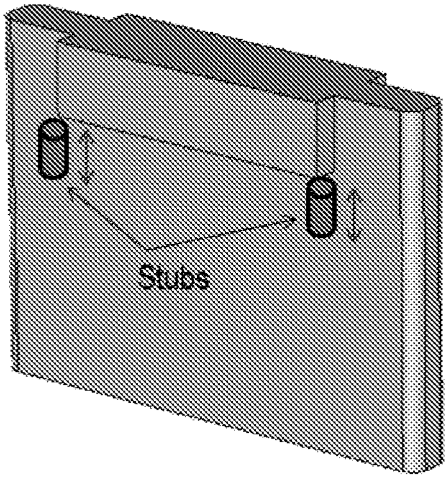
FIG. 14A illustrate how stubs can be used to adjust the dimensions of the unit cell. Please remember that the unit cell illustrated is a cavity, while the stubs represent physical elements.
Figure 14C:
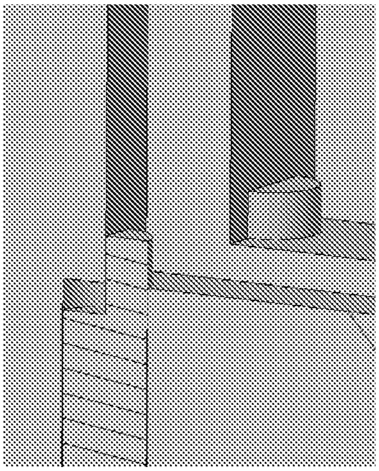
FIG. 14C illustrates a detail of FIG. 14B.
Figure 14B:
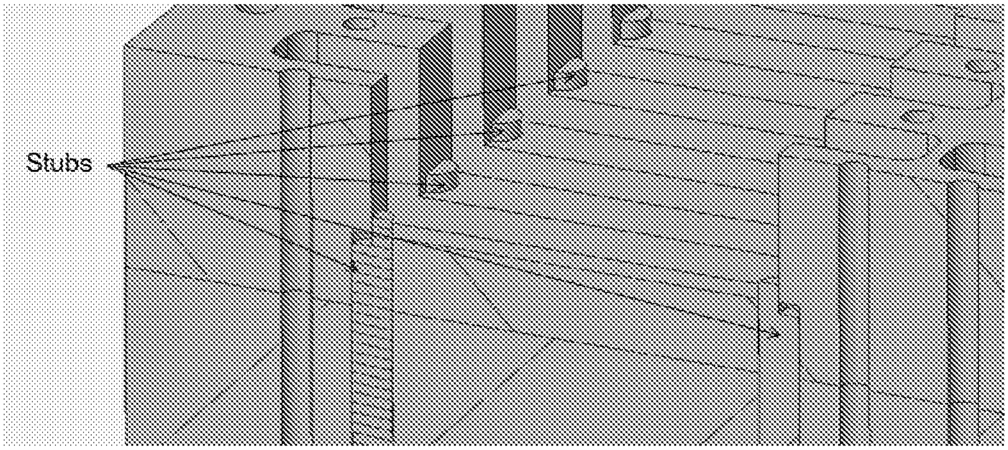
FIG. 14B illustrates in a cross sectional view with a cut away top, how stubs can be entered into the cavity to alter the dimensions of the unit cells. Here, a physical implementation of the CRLH waveguide according to an invention is shown. The cavities are the sequentially arranged unit cells arranged inside the waveguide.

In order to configure the unit cells, the unit cells comprises in a related embodiment tuning elements configured to modify internal dimensions of the unit cells. The tuning elements may be a pair of stubs arranged to be inserted into each of the unit cells as illustrated in FIGS. 14A, 14B and 14C.

In an embodiment, the invention is a method for providing a large area plasma chemical vapour deposition in a reactor chamber wherein the reactor chamber is arranged to provide a plasma region in an interior of the reactor chamber by electromagnetic energy at a first frequency. The method comprises coupling electromagnetic energy from an interior of the CRLH waveguide section to the interior of the reactor chamber via a wall coupler means of the CRLH section, wherein the CRLH waveguide section is arranged to operate with an infinite wavelength at the first frequency. The wall coupler means may here be slots as illustrated e.g. in FIG. 3.

In an embodiment the CRLH waveguide section comprises periodically cascaded unit cells.

In a related embodiment, the unit cells may comprise tuning elements configured to modify internal dimensions of the unit cells, wherein the method comprises adjusting the tuning elements.

In a related embodiment a source of electromagnetic energy having an energy output is connected to an input of the CRLH waveguide section, wherein the method comprises minimizing a measured reflected power by iteratively adjusting the tuning elements and impedance matching the source with the CRLH waveguide section.

The tuning elements may be e.g. stubs as illustrated in FIGS. 14A, 14B and 14C.

Further, the reactor chamber and the CRLH waveguide section of the method may comprise features from any of the embodiments for the LA MPCVD reactor above.

Specific Embodiment

In the following an embodiment of the invention is described with reference to the accompanying drawings. In general, this embodiment describes an LA MPCVD reactor comprising a number of CRLH waveguides positioned next to each other, e.g. four as illustrated in FIG. 3. All four waveguides shown in FIG. 3 are placed in such a way that magnetic current vector points in the same direction. Other configurations may be used consisting of any number of CRLH waveguides positioned next to each other.

Figure 4A:
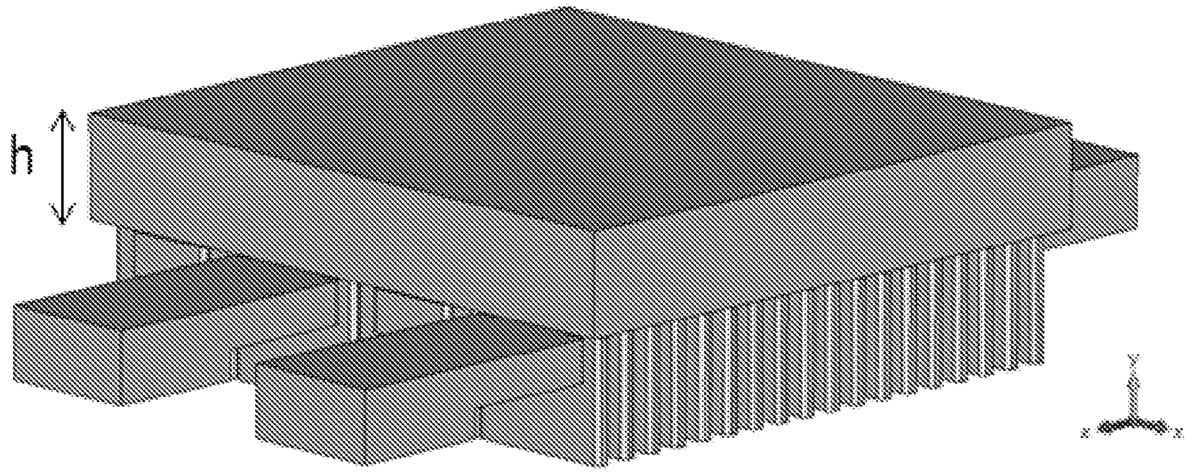
FIG. 4A illustrates in a 3D CAD model a resonant cavity according to an embodiment of the invention connected to a set of CRLH waveguides as illustrated in FIG. 3. Only the cavities are shown here.

The resonant cavity is placed on the top of the CRLH waveguides. A 3D CAD model of the corresponding resonant cavity on top of the four CRLH waveguides is shown in FIG. 4*a*. The size of the resonant cavity is determined by the area occupied by the radiating slots. The height h of the chamber is chosen to be approximately half of the wavelength of the microwave radiation coupled into the cavity. It is important to note that the size of LA MPCVD reactor resonant cavity can be scaled by simply changing the length and number of the CRLH waveguides, i.e. to alter the area occupied by the radiating slots.

Figure 5:
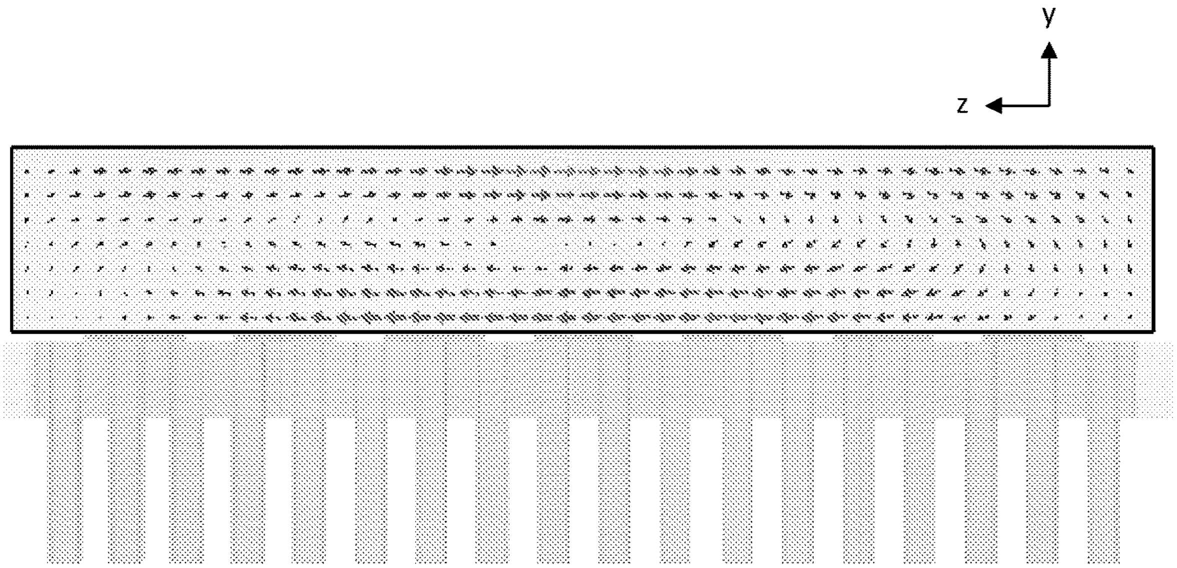
FIG. 5 illustrates magnetic field distribution in the yz direction. Here arrows indicate both direction and field strength. Larger and bolder arrows indicate larger field strength than small and thin arrows.

The microwave radiation is coupled magnetically into the resonant cavity. The cross-section view in the yz-plane of the resonant cavity depicted in FIG. 4*a* is shown in FIG. 5, where the arrows indicate the direction and strength of the magnetic field induced by radiating slot elements.

Figure 4B:
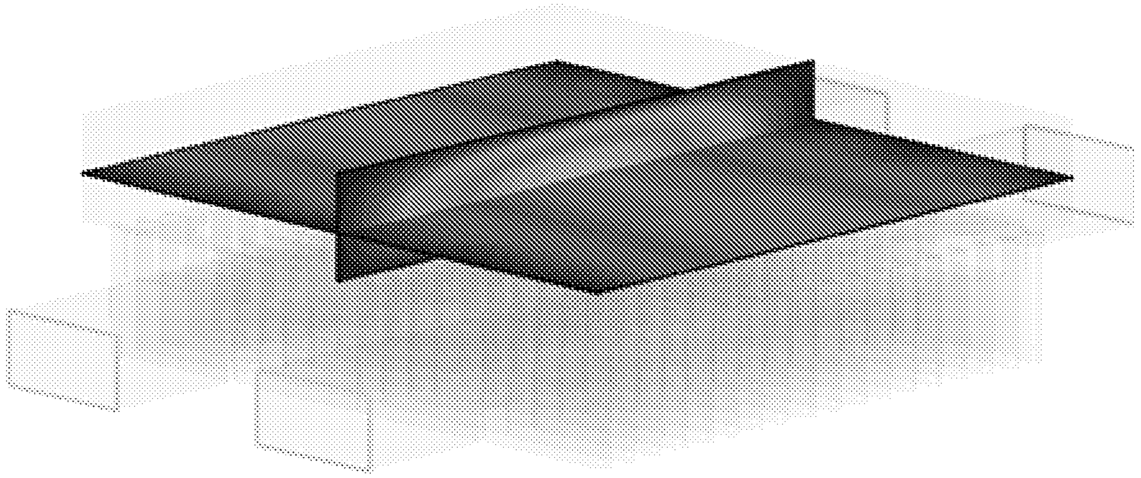
FIG. 4B illustrates electric field distributions in the yz- and xz-planes of the resonant cavity illustrated in FIG. 4A. As can be seen, the electric field is high over a larger volume of the resonant cavity.

The alternating magnetic field generates a uniform electric field in the perpendicular direction of the magnetic field across a large area of the resonant cavity as shown in FIG. 4*b*. The cross-sections of the electric field distribution in xy-, xz- and yz-planes are shown in FIG. 6.

Figure 6:
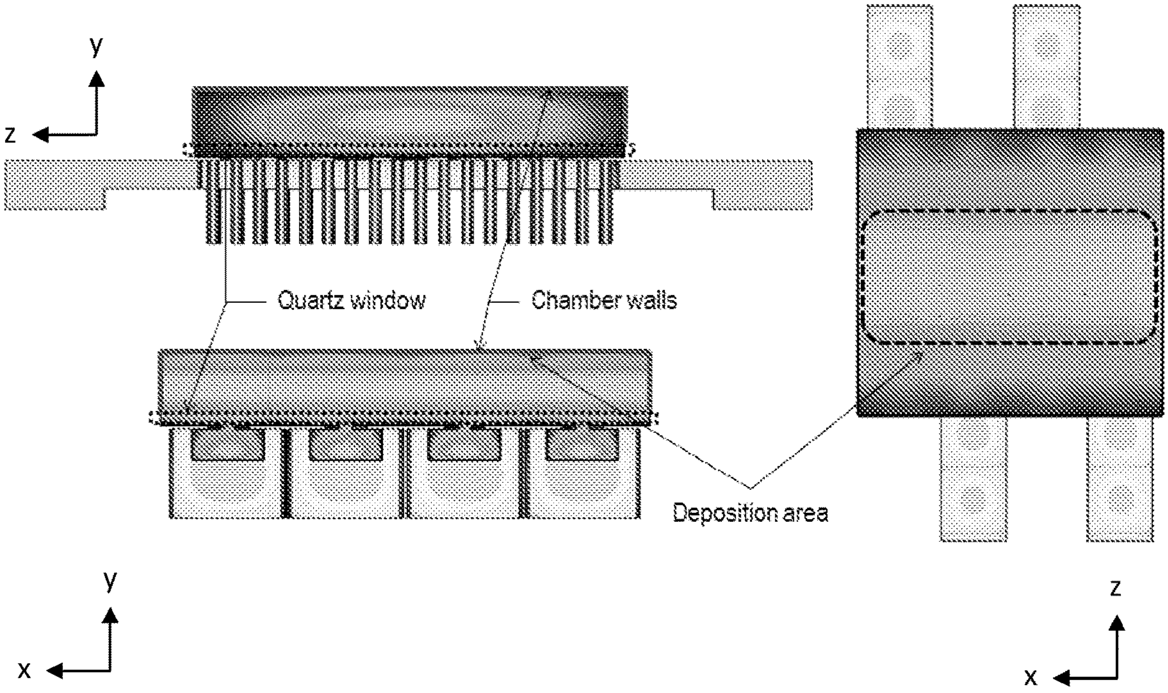
FIG. 6 illustrates cross-sections of the reactor and the electric field distribution in xy-, xz- and yz-planes for the embodiment in FIG. 4A. Solid red lines indicate walls of deposition chamber, dotted black contour represents quartz window while dashed black contour shows deposition area.

The uniform electric field ionizes a working gas and produces uniform plasma across large area, see the dashed contour in FIG. 6. The deposition chamber of the reactor has to be separated from the atmospheric pressure. This is achieved by placing a quartz window right above the radiating elements. However, placing quartz window close to the plasma region imposes several limitations. First, large area cavities require large quartz windows. Thickness of the window increases with area in order to withstand atmospheric pressure. As a result, by increasing cavity area the surface of the window gets closer to the plasma region. Second, hot plasma can yield high heat loads on the window and can damage it. Thermal damage on the window can be avoided by reducing working pressure in the chamber down to sub-mbar range thus limiting the deposition temperature of the chemical vapor deposition process.

To overcome this problem another design of the resonant cavity is proposed. The new cavity consists of interconnected bottom and top volumes, or first and second sub-chambers, as shown in FIG. 7*a*. Each volume has height h and may occupy similar area as the cavity shown in FIG. 4*a*. The distance between two volumes can vary from 130 mm to 170 mm. Selecting different distance between the volumes yields different electric field distributions in top and bottom parts.

Figure 7B:
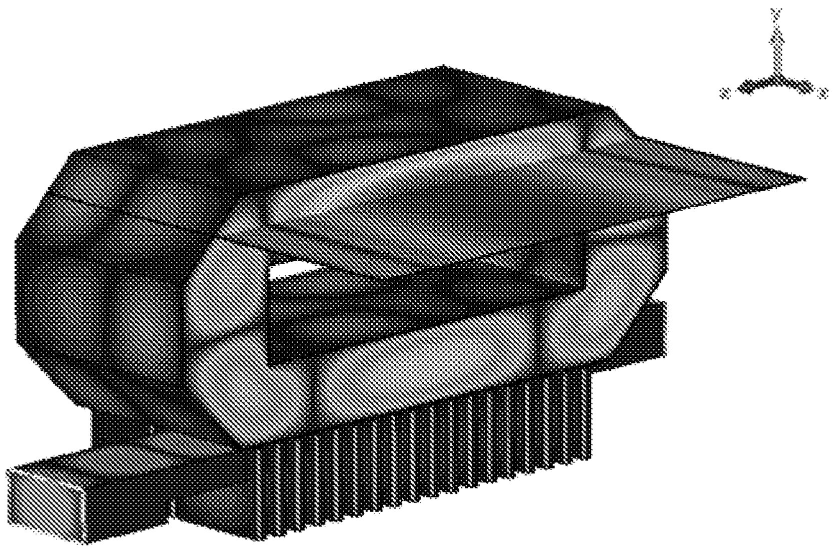
FIG. 7B is a perspective view cut-away drawing providing a 3-dimensional illustration of the electric field inside a LA MPCVD reactor apparatus according to the embodiment of invention illustrated in FIG. 7A.

FIG. 7*a* illustrates in a 3D CAD model of the resonant cavity. Cross sections of electric field distributions in the yz- and xz-planes are illustrated in FIG. 7*b*.

Figure 8:
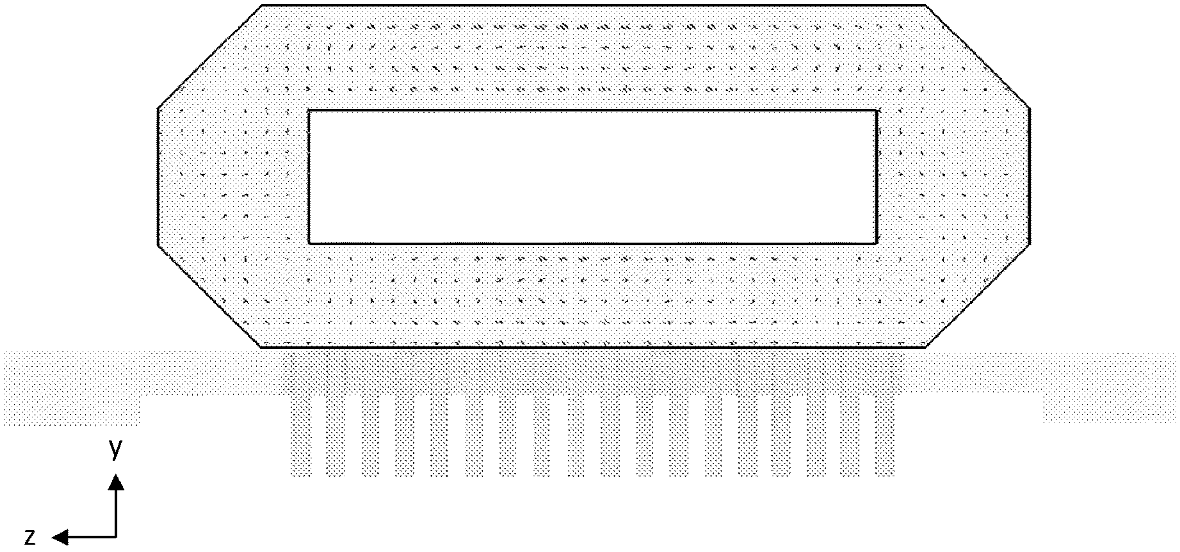
FIG. 8 illustrates magnetic field distribution in the yz direction for the embodiment of the resonant cavity in FIG. 7A. Here arrows indicate both direction and field strength. Larger and bolder arrows indicate larger field strength than small and thin arrows.

In a similar fashion as in the previous resonant cavity design, microwave radiation is coupled magnetically into the bottom volume, or first sub-chamber, as shown in FIG. 8. Electromagnetic wave propagates further through the connecting waveguides up to the top volume or second sub-chamber, yielding similar magnetic field strength pattern as shown in FIG. 5.

In the embodiments above, the resonant cavity has been illustrated arranged above the CRLH waveguide section. However, the resonant cavity may well be arranged e.g. below or at the side of the CRLH waveguide.

The relative dimensions of height width and length of the resonant chamber and the relative first and second sub chambers, as well as relative size between the first and second chambers, and distance between them may also vary, as long as they operate at the first frequency.

The CRLH waveguide or waveguides in the CRLH waveguide section may also be of different configurations. Any waveguide design with unit cells of the type specified above, e.g. curved, may potentially be used for this purpose. Instead of shorted, they may e.g. be serially interconnected.

The coupler means, such as the one or more slots in the CRLH waveguides may be arranged on any wall, i.e. side, top or bottom walls of the CRLH waveguides. Preferably where the field density distribution is longitudinal, in order to contribute to an enlarged plasma region in the resonant cavity.

Figure 9:
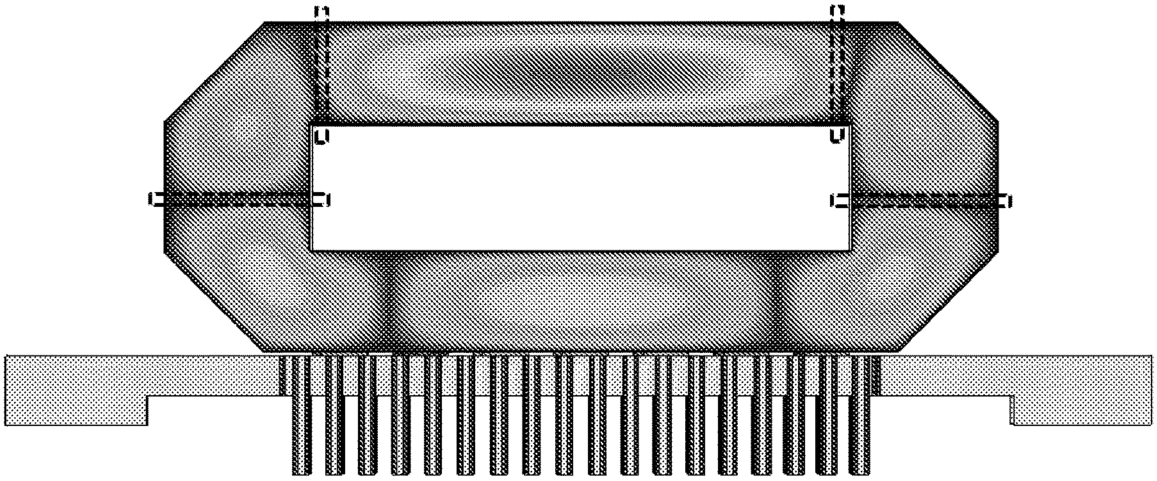
FIG. 9 illustrates in a cross sectional view the electric field distribution in yz-plane for the embodiment in FIG. 7A. Dotted black contour represents possible locations of quartz windows.

Resonant cavity design consisting of bottom and top volumes overcomes the problem of large quartz windows. Now quartz windows can be placed in several locations away from hot plasma as shown in FIG. 9. Dashed contours show vertical and horizontal locations of quartz windows. Locations are selected intentionally at places where electric field is minimal. The complete configuration of the LA MPCVD reactor with horizontally located quartz windows is shown in FIG. 10. The four CRLH waveguides are connected with a set of T-junctions and excited using one waveguide port.

An embodiment of the CRLH waveguide will now be explained. This embodiment may be combined with any of the embodiments described above.

The coupling of microwave radiation inside the resonant cavity of the LA MPCVD reactor may be achieved using a set of slotted composite right/left-handed (CRLH) waveguides each having the infinite wavelength propagation property. This allows generating a uniform high intensity electric field across large area inside the cavity. The theory about CRLH transmission lines can be found in the literature, e.g;

A. Lai et al. Composite right/left-handed transmission line metamaterials. IEEE Microwave Magazine (Volume: 5, Issue: 3, September 2004).

Amr M. Nour Eldeen and Islam A. Eshrah. CRLH Waveguide with Air-Filled Double-Ridge Corrugations. 2011 IEEE International Symposium on Antennas and Propagation (APSURSI).

T. Ueda et al. Dielectric-Resonator-Based Composite Right/Left-Handed Transmission Lines and Their Application to Leaky Wave Antenna. IEEE Transactions on Microwave Theory and Techniques (Volume: 56, Issue: 10, October 2008).

L. Shaowei et al. Left-Handed Transmission Line Based on Resonant-Slot Coupled Cavity Chain. IEEE Microwave and Wireless Components Letters (Volume: 17, Issue: 4, April 2007)

Y. Chen et al. Unequally Spaced and Excited Resonant Slotted-Waveguide Antenna Array Based on an Improved Resonant-Slot Coupled Cavity Chain Composite Right/Left-Handed Waveguide. Progress In Electromagnetics Research, Vol. 110, 421-435, 2010.

The CRLH waveguide consists of a chain of periodically cascaded unit cells. Each unit cell has a unique property of supporting left-hand (LH) and right-hand (RH) wave propagation and can be represented using equivalent circuit model as described by Ueda et al. above. In the balanced case, a unit cell does not have a stop band and there is a seamless transition from LH to RH bands in the dispersion diagram. Since the proposed invention uses an infinite wavelength propagation property of CRLH waveguide, each unit cell in the waveguide must be balanced. This criterion can be fulfilled by different designs of the unit cell, for example, with ones as proposed in the references Elden and Esrah, Uead et al., Shaowei et al. and Chen et al. above.

Figure 13A:
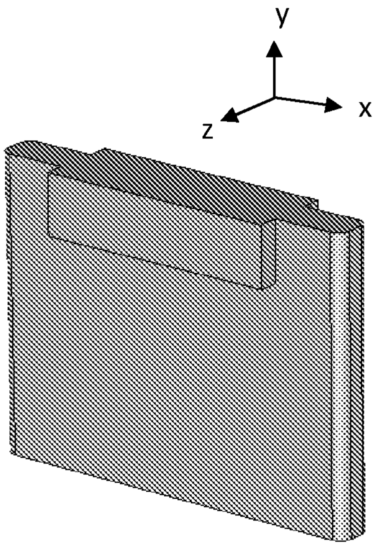
FIG. 13A is a perspective view of a unit cell cavity of the CRLH waveguide.
Figure 13B:
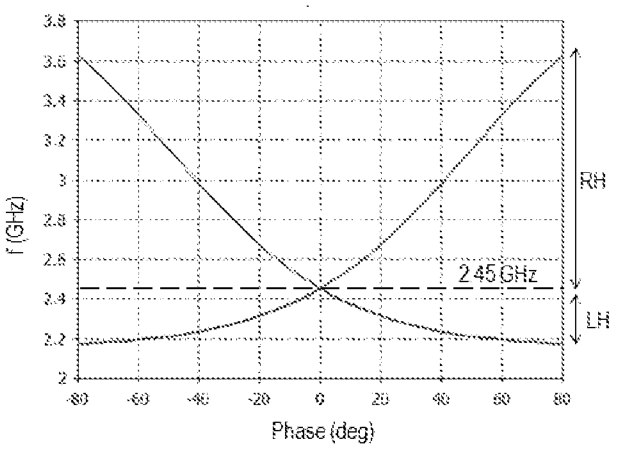
FIG. 13B is a dispersion diagram representing a phase shift per unit cell with a frequency of 2.45 GHz.
Figure 13C:
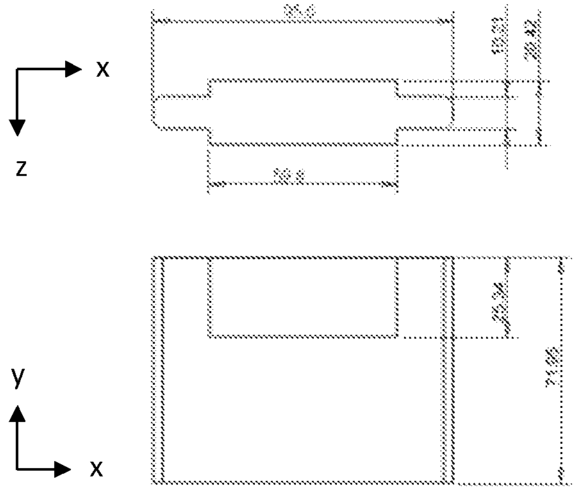
FIG. 13C illustrates the measures of the unit cell cavity in mm according to an embodiment of the invention when the frequency is 2.45 GHz.
Figure 13D:
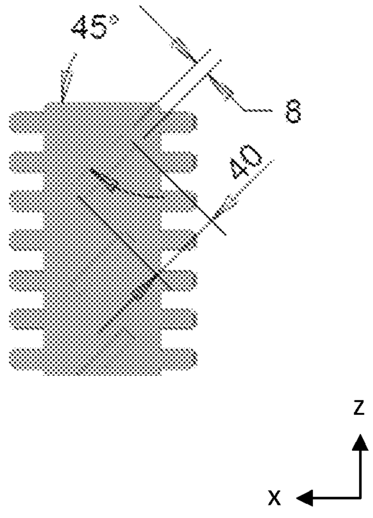
FIG. 13D illustrates the measures and arrangement of the slots of the CRLH waveguides according to an embodiment of the invention. The slots are in this embodiment arranged degree relative to the z and x directions of the waveguide and have a length of 40 mm and a width of 8 mm.

The current embodiment of CRLH waveguide employs similar design of the unit cell as described By Chen et al. The unit cell shown in FIG. 13A is designed in a such way that the dispersion diagram depicted in FIG. 13B has seamless transition from LH to RH bands and therefore the cell is balanced. As can be seen from OB, the infinite wavelength propagation frequency is at 2.45 GHz and matches the working frequency of the energy source, or microwave generator.

The unit cell may be realized in various geometrical shapes and support infinite wavelength propagation frequency others than 2.45 GHz.

Figure 2:
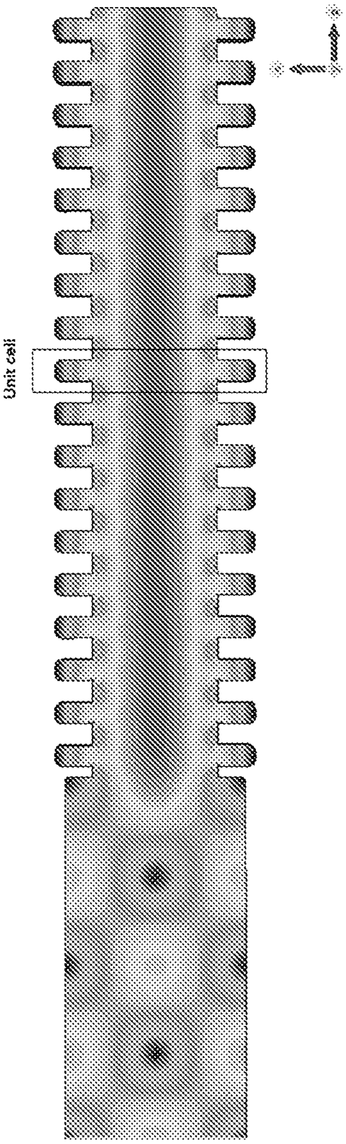
FIG. 2 illustrates the current density on the top surface of the cavity of FIG. 1.

The CRLH waveguide consists of an array of periodically cascaded unit cells and is terminated with a metallic wall as is shown in FIG. 3. The microwave radiation to the CRLH waveguide is fed through the transition waveguide. Due to the CRLH waveguide infinite wavelength propagation property, the surface current along the waveguide (z-direction) flows undisrupted as shown in FIGS. 2 and 3. Therefore, radiating slot elements used to couple microwave radiation into the cavity can be placed at almost arbitrary positions, and close to each other, compared to conventional waveguides where adjacent slots are separated by the half of guide wavelength (λg). Thus, uniform electromagnetic field distribution over large area may be achieved with the invention.

The radiation mechanism of the slots is the same as for the conventional waveguides and the amount of each slot radiation is determined by the intercepted current. As a result, the radiation power of the slot depends on the tilt angle with respect to the corresponding centerline of the CRLH waveguide. Here, all slots are rotated by 45 degrees to maximize the radiation power.

An effect of the invention is that the reactor cavity can be scaled. This can be done by extending the CRLH waveguides or adding more waveguides as indicated above. This would effectively increase the size of the region of generated plasma.

Another effect is that the LA MPCVD according to embodiments of the invention can work at higher than sub-mbar pressure range while other implementations of LA MPCVD reactors, e.g. with standard waveguides, can operate only with lower pressures.

This is achieved due to the novel coupling technology made possible by the CRLH waveguides, that yields rather uniform and shallow shape of the plasma across deposition area compared to prior art. The height of the plasma is less than half wavelength at 2.45 GHz meaning that plasma can effectively absorb input microwave radiation. This yields high absorbed power densities that allows operation at higher pressures.

The unit cell may be designed in such a way that a phase shift per unit cell for working frequency of 2.45 GHz is zero.

A phase shift per unit cell of zero for other frequencies than 2.45 GHz or any other operating frequency, may in an embodiment that can be combined with any of the embodiments above, be achieved by changing the dimensions of the unit cell. This is particularly important for the microwave generators which operating frequency is not locked and is a function of the output power. Typically, the frequency of the industrial magnetrons increases with power and can deviate from the nominal frequency by an order of 1%. Therefore, the shape of the unit cell can be actively adapted to account for the change of the working frequency as the output power of the generator changes.

Figure 15:
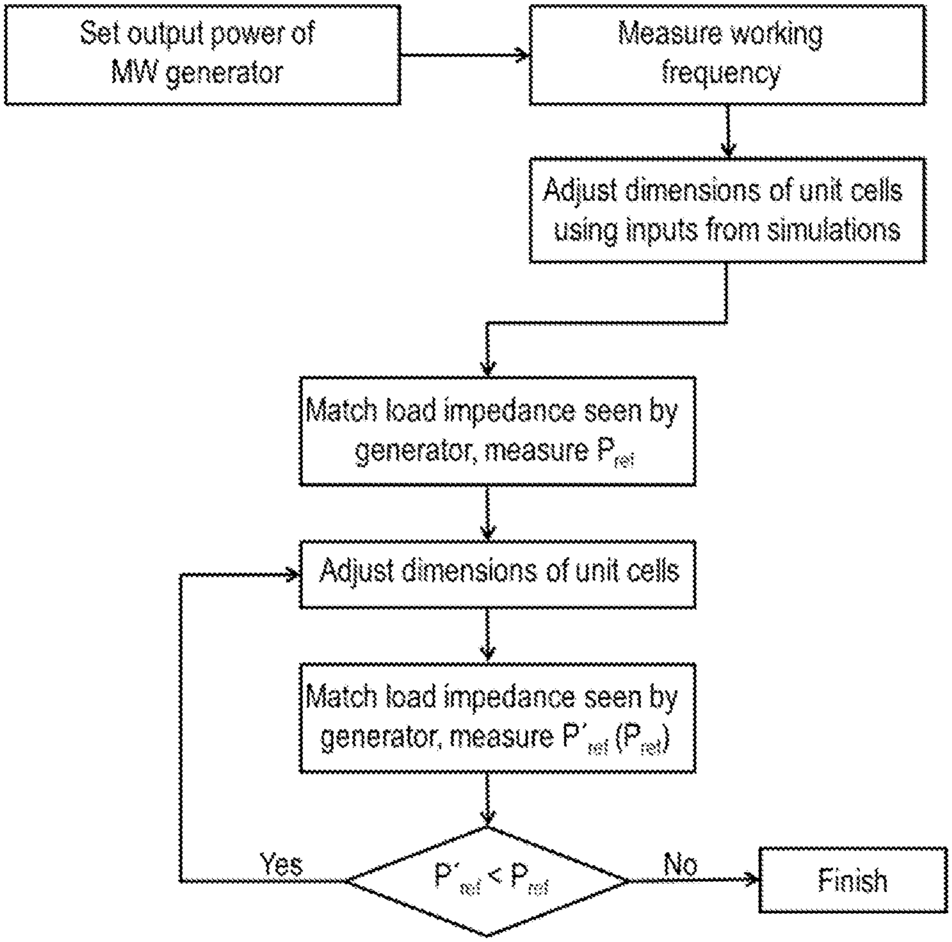

In a related embodiment the change of unit cell shape is achieved in such a way that a phase shift per unit cell for any frequency is zero. All cells in CRLH waveguide(s) may be adapted simultaneously. A block diagram illustrating a method of adaptive control of the unit cells is shown in FIG. 15.

The method begins by setting the output power of the microwave generator and measuring the corresponding working frequency. Next, shapes off all unit cells are changed by adjusting certain dimensions of the cells or inserting tuning elements such as stubs and keeping cells balanced. The shape of each unit cell must be altered in the same fashion using inputs from the simulations or empirical data. The frequency of adjusted cells must match the working frequency measured in previous step. After adjustment of the cells impedance seen by the generator may be matched with impedance matching unit such as 3-stub tuner arranged between the energy source and the CRLH waveguide. The reflected power Pref measured in this step is kept for later use. Since inputs used for cell adjustment have errors, in the next step, cells should be altered by small amount compared to the adjustment in the third step. Next, impedance is matched again and the corresponding reflected power P'ref is measured. Lastly, Pref and P'ref are compared. If P'ref<Pref cells are altered again followed by impedance matching step and new reflected power measurement. These steps are repeated iteratively until reflected power is minimized. If the output power of the generator is changed procedure is repeated again.

Adaptive control of the unit cell, for example, can be achieved by simultaneously inserting two (truncated) stubs into the bottom part of cell as shown in FIG. 14. The unit cell can be described using equivalent circuit model by decomposing the cell into a set of corrugations, stub and rectangular waveguide with corresponding shunt inductances, series capacitance, and series inductance and shunt capacitance. Therefore, inserting (truncated) stubs into the cell effectively changes inductances and capacitances of the cell elements. As a result, the frequency which corresponds a phase shift per unit cell of zero changes. This allows adaptively control each unit cell in a CRLH waveguide(s). The depth of the stubs insertion should be chosen to match the working frequency of the generator so the surface current density of the waveguide remains uniform and unchanged. The unit cells should be kept balanced during the process.

Figure 11:
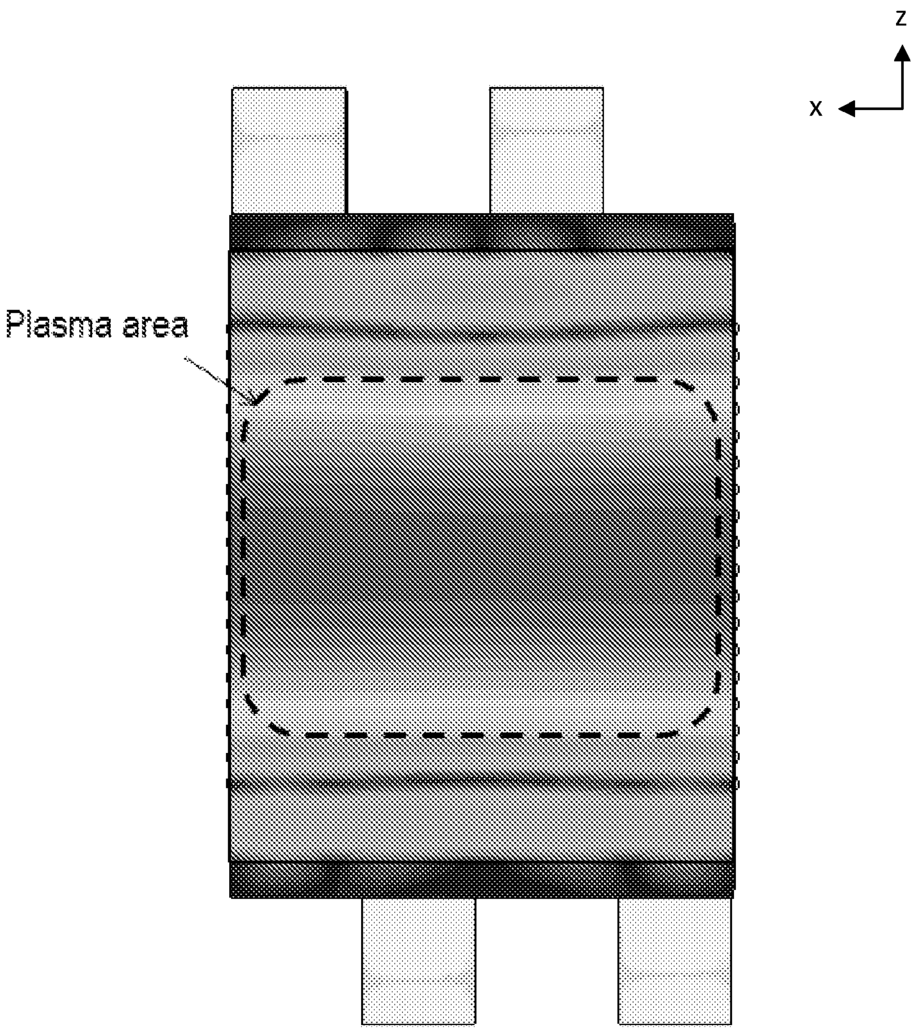
FIG. 11 illustrates in a cross-section the electric field distribution in xz-plane. Dashed contour indicates plasma region. The distribution could represent the distribution of the embodiment illustrated in FIG. 4A, or the distribution of the embodiment of FIG. 7A, second sub chamber, upper volume of the reactor chamber.

The chemical vapor deposition, CVD, of diamond material may be realized in the following way. The uniform electric field shown in FIG. 7B and FIG. 9 ionizes working gas and produces uniform plasma across large area as shown in FIG. 11.

The typical working gases for diamond CVD process are hydrogen and methane. Methane acts as a carbon source and atomic hydrogen, dissociated from molecular gas by plasma, is necessary to selectively etch graphitic content in the process. Other gases such as nitrogen, oxygen or argon can be introduced into chamber to alter the CVD process parameters such as growth rate and substrate temperature. The schematic representation of an embodiment of the LA MPCVD reactor is shown in FIG. 12. It is important to note that both top and bottom planes of the presented chamber cavity, i.e. the second sub chamber, can be used for deposition process. Here, only deposition process on the bottom planes is presented.

The working gas is introduced from the top of the second sub chamber. Gas is delivered to the substrate using tubes positioned above the substrate. Each tube contains a set of holes for uniform gas distribution across the whole deposition area.

Figure 12A:
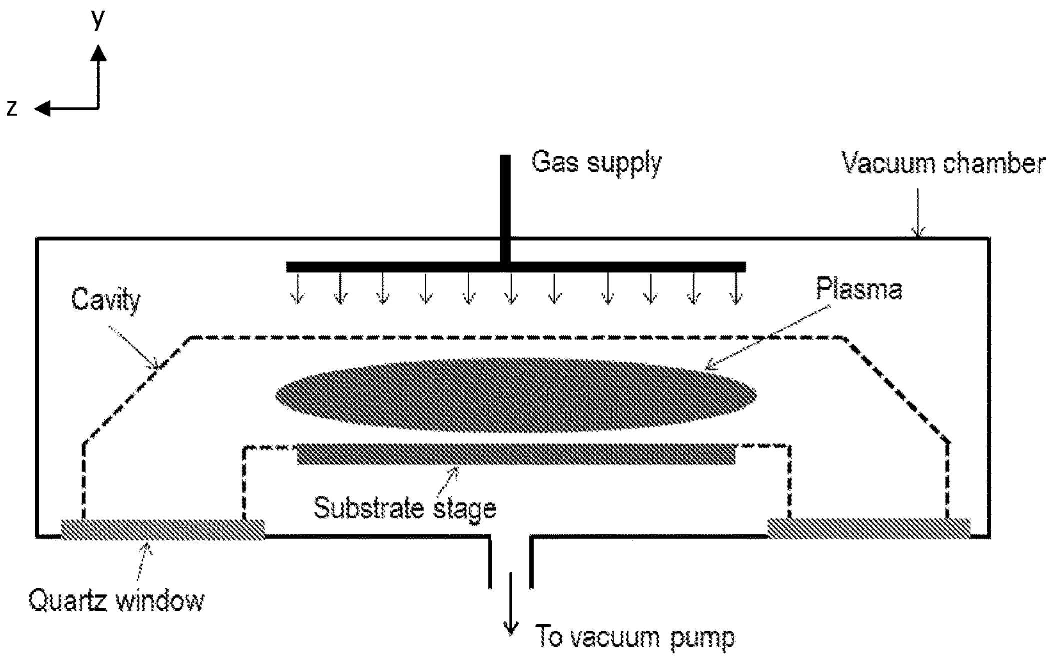
FIG. 12A is a cross sectional schematic view of a detail of the reactor according to the embodiment illustrated in FIG. 7A.
Figure 12B:
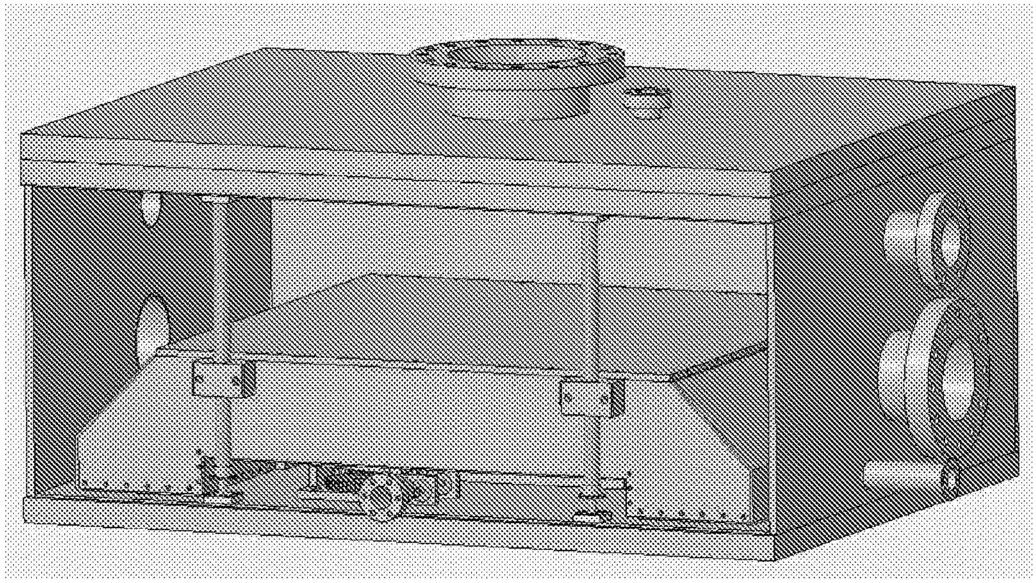
FIG. 12B is a perspective view illustrating a physical implementation of the upper half of the reactor vacuum chamber shown in FIG. 10B. In this view, the front plate has been removed to illustrate the detail of the reactor shown in FIG. 12A above.

The plasma region is indicated by red elliptic figure in the middle of FIG. 12A. It covers a substrate stage represented by magenta rectangular. Diamond material is deposited on the substrate placed on top of the stage. Substrate is heated by plasma but if necessary the stage may be heated as well by RF induction or other means.

Process gas may exit the chamber using a vacuum pump. Pumping speed may be actively adjusted during the CVD process to keep the pressure stable.

The invention claimed is:

1. A large area microwave plasma chemical vapour deposition (LA MPCVD) reactor apparatus, comprising:

a reactor chamber adapted to provide a plasma region in an interior of the reactor chamber by electromagnetic energy at a first frequency;

a Composite Right/Left-Handed (CRLH) waveguide section comprising a plurality of periodically cascaded unit cells, each unit cell being balanced, wherein the CRLH waveguide section is adapted to operate with an infinite wavelength at the first frequency and having in a wall of the CRLH waveguide section a coupler arranged to couple electromagnetic energy from an interior of the CRLH waveguide section to the interior of the reactor chamber; and a first sub-chamber and a second sub-chamber, wherein the first sub-chamber comprises the coupler, wherein the second sub-chamber is adapted to comprise the plasma region, and wherein the electromagnetic energy is provided from the CRLH waveguide section to the second sub-chamber via the first sub-chamber.

2. The LA MPCVD reactor apparatus of claim 1, wherein the coupler comprises a plurality of electromagnetic energy couplers spaced with respect to each other.

3. The LA MPCVD reactor apparatus of claim 1, wherein the coupler comprises a slot in the wall of the CRLH waveguide section.

4. The LA MPCVD reactor apparatus of claim 1 wherein one or more CRLH waveguides in the CRLH waveguide section has a first energy input end coupled to an electromagnetic energy output.

5. The LA MPCVD reactor apparatus of claim 4, wherein one or more CRLH waveguides in the CRLH waveguide section has a second, shorted end.

6. The LA MPCVD reactor apparatus of claim 1, wherein the first sub-chamber and second sub-chamber have the same cross sectional area.

7. The LA MPCVD reactor apparatus of claim 1, wherein the second sub-chamber comprises quartz windows arranged to separate the plasma region from atmospheric pressure.

8. The LA MPCVD reactor apparatus of claim 1, wherein the first sub-chamber and second sub-chamber are arranged on top of each other and interconnected in each end.

9. The LA MPCVD reactor apparatus of claim 1, wherein the electromagnetic energy is microwave energy at the first frequency.

10. The LA MPCVD reactor apparatus of claim 1, wherein the first frequency is 2.45 GHz.

11. The LA MPCVD reactor apparatus of claim 1, wherein the CRLH waveguide section comprises a plurality of CRLH waveguides arranged side-by-side.

12. The LA MPCVD reactor apparatus of claim 1, wherein the periodically cascaded unit cells comprises tuning elements configured to modify internal dimensions of the periodically cascaded unit cells.

13. The LA MPCVD reactor apparatus of claim 12, wherein the tuning elements comprises a pair of stubs arranged to be inserted into the periodically cascaded unit cells.

* * * * *